US008158199B2

(12) United States Patent
Jiang et al.

(10) Patent No.: US 8,158,199 B2
(45) Date of Patent: Apr. 17, 2012

(54) METHOD FOR MAKING INDIVIDUALLY COATED AND TWISTED CARBON NANOTUBE WIRE-LIKE STRUCTURE

(75) Inventors: Kai-Li Jiang, Beijing (CN); Liang Liu, Beijing (CN); Kai Liu, Beijing (CN); Qing-Yu Zhao, Beijing (CN); Yong-Chao Zhai, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 543 days.

(21) Appl. No.: 12/321,551

(22) Filed: Jan. 22, 2009

(65) Prior Publication Data

US 2009/0196985 A1 Aug. 6, 2009

(51) Int. Cl.
*C23C 16/06* (2006.01)

(52) U.S. Cl. .................... 427/250; 427/255.7; 427/170; 427/177; 427/376.1; 427/443.2

(58) Field of Classification Search .................. 427/250, 427/255.7, 177, 170, 376.1, 443.2; 117/84
See application file for complete search history.

(56) References Cited

U.S. PATENT DOCUMENTS

| | | | | |
|---|---|---|---|---|
| 4,132,828 | A | 1/1979 | Nakamura et al. | |
| 4,461,923 | A | 7/1984 | Bogese, II | |
| 7,390,963 | B2 | 6/2008 | Scherer | |
| 7,413,474 | B2 | 8/2008 | Liu et al. | |
| 7,704,480 | B2 | 4/2010 | Jiang et al. | |
| 7,750,240 | B2 | 7/2010 | Jiang et al. | |
| 2002/0048632 | A1 * | 4/2002 | Smalley et al. | 427/230 |
| 2004/0020681 | A1 | 2/2004 | Hjortstam et al. | |
| 2004/0051432 | A1 | 3/2004 | Jiang et al. | |
| 2004/0053780 | A1 | 3/2004 | Jiang et al. | |
| 2004/0058153 | A1 * | 3/2004 | Ren et al. | 428/408 |
| 2005/0208304 | A1 * | 9/2005 | Collier et al. | 428/403 |
| 2007/0053824 | A1 * | 3/2007 | Subramanya et al. | 423/447.3 |
| 2007/0151744 | A1 | 7/2007 | Chen | |
| 2007/0166223 | A1 | 7/2007 | Jiang et al. | |
| 2007/0293086 | A1 | 12/2007 | Liu et al. | |
| 2008/0170982 | A1 * | 7/2008 | Zhang et al. | 423/447.3 |
| 2009/0068241 | A1 * | 3/2009 | Britz et al. | 424/409 |
| 2009/0196981 | A1 * | 8/2009 | Liu et al. | 427/113 |
| 2009/0196982 | A1 * | 8/2009 | Jiang et al. | 427/113 |

(Continued)

FOREIGN PATENT DOCUMENTS

CN 1483667 3/2004

(Continued)

OTHER PUBLICATIONS

Herrmann, C.F., et al., "Multilayer and functional coatings on carbon nanotubes using atomic layer deposition". Applied Physics Letters 87, 123110 (2005), pp. 1-3.*

(Continued)

*Primary Examiner* — Bret Chen
(74) *Attorney, Agent, or Firm* — Altis Law Group, Inc.

(57) ABSTRACT

A method for making an individually coated and twisted carbon nanotube wire-like structure, the method comprising the steps of: providing a carbon nanotube structure having a plurality of carbon nanotubes; forming at least one conductive coating on the plurality of carbon nanotubes in the carbon nanotube structure; and twisting the carbon nanotube structure.

19 Claims, 7 Drawing Sheets

U.S. PATENT DOCUMENTS

| | | | | |
|---|---|---|---|---|
| 2009/0208742 | A1 | 8/2009 | Zhu et al. | |
| 2010/0313951 | A1 * | 12/2010 | Nalamasu et al. | 136/256 |

FOREIGN PATENT DOCUMENTS

| | | | |
|---|---|---|---|
| CN | 1484275 | | 3/2004 |
| CN | 1982209 | | 6/2007 |
| CN | 1992099 | | 7/2007 |
| CN | 101003909 | | 7/2007 |
| CN | 101090011 | A | 12/2007 |
| TW | 200724486 | | 7/2007 |
| TW | 200802414 | | 1/2008 |
| TW | 200939252 | | 9/2009 |
| WO | 2006026539 | | 3/2006 |

OTHER PUBLICATIONS

Suzuura, Hidekatsu, et al., "Conductance of twisted carbon nanotubes". Physica E 34 (2006) pp. 674-677.*

Zhang, Mei, et al., "Multifunctional Carbon Nanotube Yarns by Downsizing an Ancient Technology". Science, vol. 306 Nov. 19, 2004, pp. 1358-1361.*

Hertel, Tobias, et al., "Deformation of carbon nanotubes by surface van der Waals forces". Physical Review B, vol. 58, No. 20, Nov. 15, 1998-II, pp. 13870-13873.*

Xiao, Jianliang, et al., "Alignment Controlled Growth of Single-Walled Carbon Nanotubes on Quartz Substrates". Nano Letters 2009, vol. 9, No. 12, pp. 4311-4319.*

Mei Zhang et al., "Strong, Transparent, Multifunctional, Carbon Nanotube Sheets", Science, Aug. 19, 2005, pp. 1215-1219, vol. 309, U.S. Washington.

Y.Zhang et al., "Metal coating on suspended carbon nanotubes and its implication to metal-tube interaction", Chemical Physics Letters, Nov. 24, 2000, pp. 35-41, vol. 331.

Youngmi Cho et al., "Electronic Structure Tailoring and Selective Adsorption Mechanism of Metal-coated Nanotubes", Nanoletters, Dec. 18, 2007, pp. 81-86, vol. 8, U.S.

Y.Zhang et al.Metal coating on suspended carbon nanotubes and its implication to metal-tube interaction, Chemical Physics Letters,Nov. 24, 2000,35-41,331,Elsevier Science.

Li et al., Electroless Plating of Carbon Nanotube with Gold, Journal of Materials Science & Engineering, vol. 22, No. 1, pp. 48-51, Feb. 2004. Passage 2 of Left col. of p. 48 and Paragraph 3.2 of pp. 49-50 may be relevant.

Li Xia et al."Electroless Plating of Carbon Nanotube with Gold". Journal of Materials Science & Engineering,vol. 22 (2004);pp. 48-51.

* cited by examiner

METHOD FOR MAKING INDIVIDUALLY COATED AND TWISTED CARBON NANOTUBE WIRE-LIKE STRUCTURE

RELATED APPLICATIONS

This application is related to commonly-assigned application entitled,

"COAXIAL CABLE", U.S. patent application No. 12/321,572, filed Jan. 22, 2009; "COAXIAL CABLE", U.S. patent application No. 12/321,569, filed Jan, 22, 2009; "CARBON NANUTUBE WIRE-LIKE STRUCTURE", U.S. patent application No. 12/321,568, filed Jan. 22, 2009; "METHOD FOR MAKING COAXIAL CABLE", U.S. patent application No. 12/321,573, filed Jan. 22, 2009; "CARBON NANUTUBE COMPOSITE FILM", U.S. patent application No. 12/321,557, filed Jan, 22, 2009; "METHOD FOR MAKING CARBON NANOTUBE FILM", U.S. patent application No. 12/321,570, filed Jan. 22, 2009. The disclosure of the above-identified applications are incorporated herein by reference.

1. Technical Field

The present disclosure relates to methods for making individually coated and twisted carbon nanotube wire-like structures and, particularly, to a method for making an individually coated and twisted carbon nanotube wire-like structure.

2. Discussion of Related Art

Carbon nanotubes (CNTs) are a novel carbonaceous material and are received a great deal of interest since the early 1990s. Carbon nanotubes have interesting and potentially useful heat conducting, electrical conducting, and mechanical properties.

Fan et al. (Referring to "Spinning Continuous CNT Yarns, Nature", 2002, 419:801) disclosed a method for making a continuous carbon nanotube yarn from a super-aligned carbon nanotube array. The carbon nanotube yam includes a plurality of carbon nanotube segments joined end to end and combined by van der Waals attractive therebetween. The carbon nanotube segments have an almost equal length. Each carbon nanotube segment includes a plurality of carbon nanotubes parallel with each other. However, since adjacent two carbon nanotube segments have an overlap joint, the continuous carbon nanotube yarn has a high resistance at the overlap joint of adjacent two carbon nanotube segments. Thus, the continuous carbon nanotube yarn has a lower conductivity than metal wire used in an art of signal and electrical transmissions.

What is needed, therefore, is a twisted carbon nanotube wire-like structure and method for making the same in which the above problems are eliminated or at least alleviated.

BRIEF DESCRIPTION OF THE DRAWINGS

Many aspects of the present twisted carbon nanotube wire-like structure and method for making the same can be better understood with references to the accompanying drawings. The components in the drawings are not necessarily drawn to scale, the emphasis instead being placed upon clearly illustrating the principles of the present twisted carbon nanotube wire-like structure and method for making the same.

Figure 1:
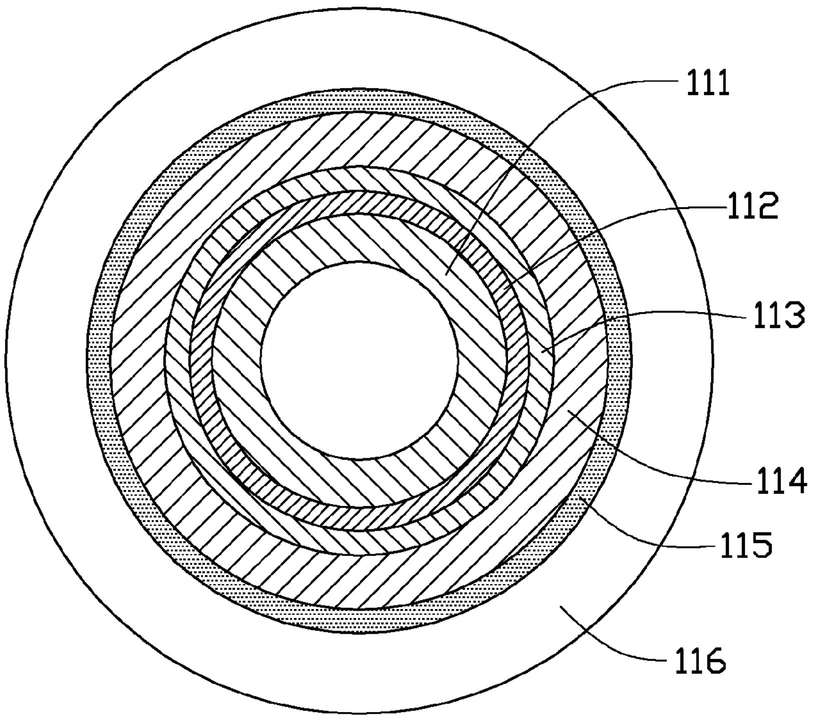
FIG. 1 is a schematic cross section view of a carbon nanotube in the individually coated and twisted carbon nanotube wire-like structure in accordance with the present embodiment.

Corresponding reference characters indicate corresponding parts throughout the several views. The exemplifications set out herein illustrate at least one embodiment of the present individually coated and twisted carbon nanotube wire-like structure and method for making the same, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present individually coated and twisted carbon nanotube wire-like structure and method for making the same.

The individually coated and twisted carbon nanotube wire-like structure includes a plurality of carbon nanotubes and at least one conductive coating on an outer surface of each carbon nanotube. Wire-like structure means that the structure has a large ratio of length to diameter.

The carbon nanotubes are joined end-to-end by van der Waals attractive force therebetween and have a substantially equal length. The carbon nanotubes can be arranged along a length axis of the individually coated and twisted carbon nanotube wire-like structure. A diameter of the individually coated and twisted carbon nanotube wire-like structure can range from about 4.5 nanometers to about millimeter or even larger. In the present embodiment, the diameter of the individually coated and twisted carbon nanotube wire-like structure ranges from about 10 nanometers to about 30 micrometers.

Referring to FIG. 1, a plurality of carbon nanotubes 111 in the individually coated and twisted carbon nanotube wire-like structure (not shown) are covered by at least one conductive coating on the outer surface thereof. In the present embodiment, each carbon nanotube in the individually coated and twisted carbon nanotube wire-like structure (not shown) is covered by at least one conductive coating on the outer surface thereof. The at least one conductive coating can include a wetting layer 112, a transition layer 113, a conductive layer 114, and an anti-oxidation layer 115. The wetting layer 112 is the most inner layer, covers the surface of the carbon nanotube 111, and combines directly with the carbon nanotube 111. The transition layer 113 covers and wraps the wetting layer 112. The conductive layer 114 covers and wraps the transition layer 113. The anti-oxidation layer 115 covers and wraps the conductive layer 114.

Typically, carbon nanotubes 111 cannot be adequately wetted by most metallic materials, thus, the wetting layer 112 is arranged for wetting the carbon nanotube 111, as well as combining the carbon nanotube 111 with the conductive layer 114. The material of the wetting layer 112 can be selected from a group consisting of iron (Fe), cobalt (Co), nickel (Ni), palladium (Pd), titanium (Ti), and alloys thereof. A thickness of the wetting layer 112 ranges from about 1 nanometer to about 10 nanometers. In the present embodiment, the material of the wetting layer 112 is Ni and the thickness of the wetting layer 112 is about 2 nanometers. The use of a wetting layer 112 is optional and can be used if required.

The transition layer 113 is arranged for combining the wetting layer 112 with the conductive layer 114. The material of the transition layer 113 can be combined with the material of the wetting layer 112 as well as the material of the conductive layer 114, such as copper (Cu), silver (Ag), or alloys thereof. A thickness of the transition layer 113 ranges from about 1 nanometer to about 10 nanometers. In the present embodiment, the material of the transition layer 113 is Cu and the thickness thereof is about 2 nanometers. The use of a transition layer 113 is optional.

The conductive layer 114 is arranged for enhancing the conductivity of the individually coated and twisted carbon nanotube wire-like structure. The material of the conductive layer 114 can be selected from a group consisting of Cu, Ag, gold (Au) and alloys thereof. A thickness of the conductive layer 114 ranges from about 1 nanometer to about 20 nanometers. In the present embodiment, the material of the conductive layer 114 is Ag and the thickness thereof is about 10 nanometers.

The anti-oxidation layer 115 is arranged for preventing the oxidation of the individually coated and twisted carbon nanotube wire-like structure in the making process. The oxidation of the individually coated and twisted carbon nanotube wire-like structure will reduce the conductivity thereof. The material of the anti-oxidation layer 115 can be Au, platinum (Pt), and any other anti-oxidation metallic materials or alloys thereof. A thickness of the anti-oxidation layer 115 ranges from about 1 nanometer to 10 nanometers. In the present embodiment, the material of the anti-oxidation layer 115 is Pt and the thickness is about 2 nanometers. The anti-oxidation layer 115 is optional.

Furthermore, a strengthening layer 116 can be applied on the conductive coating to enhance the strength of the individually coated and twisted carbon nanotube wire-like structure. The material of the strengthening layer 116 can be a polymer with high strength, such as polyvinyl acetate (PVA), polyvinyl chloride (PVC), polyethylene (PE), or paraphenylene benzobisoxazole (PBO). A thickness of the strengthening layer 116 ranges from about 0.1 micrometers to 1 micrometer. In the present embodiment, the strengthening layer 116 covers the anti-oxidation layer 115, the material of the strengthening layer 116 is PVA, and the thickness of the strengthening layer is about 0.5 microns. The strengthening layer 116 is optional.

Figure 2:
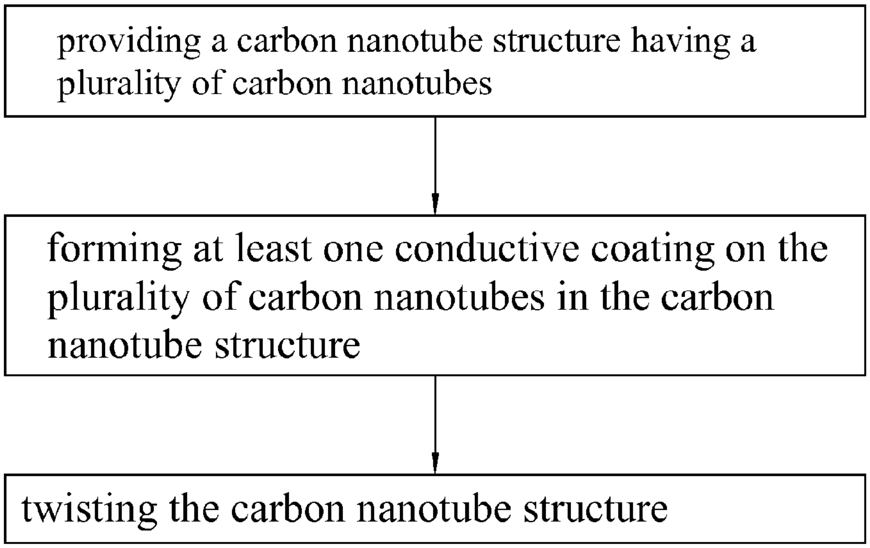
FIG. 2 is a flow chart of a method for making the individually coated and twisted carbon nanotube wire-like structure.
Figure 3:
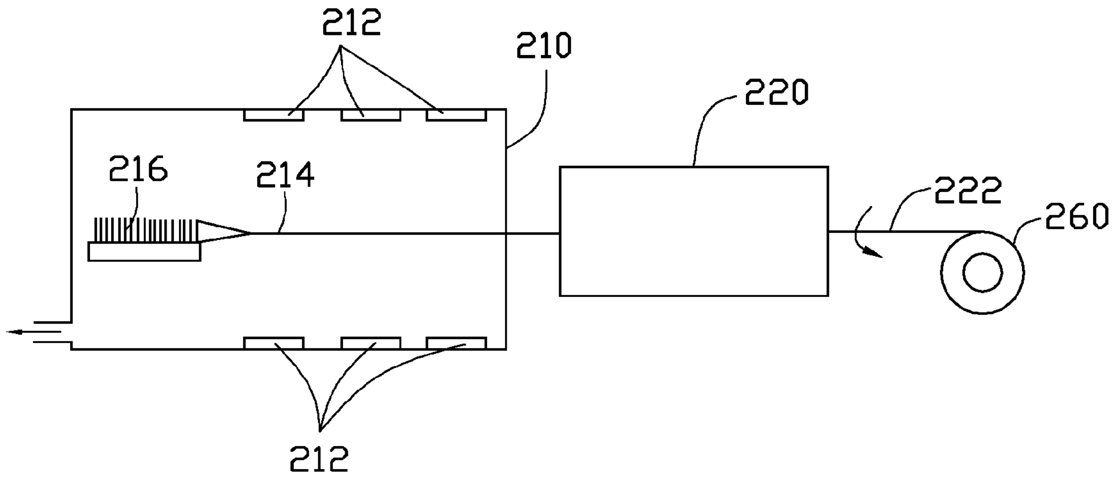
FIG. 3 is an apparatus for making the individually coated and twisted carbon nanotube wire-like structure of the present embodiment.

Referring to FIG. 2 and FIG. 3, a method for making the individually coated and twisted carbon nanotube wire-like structure 222 includes the following steps: (a) providing a carbon nanotube structure 214 having a plurality of carbon nanotubes; and (b) forming at least one conductive coating on the plurality of carbon nanotubes in the carbon nanotube structure 214; and (c) twisting the carbon nanotube structure 214 with at least one conductive coating thereon to acquire a individually coated and twisted carbon nanotube wire-like structure 222.

In step (a), the carbon nanotube structure 214 can be a carbon nanotube film. The carbon nanotube film includes a plurality of carbon nanotubes, and there are interspaces between adjacent two carbon nanotubes. Carbon nanotubes in the carbon nanotube film can parallel to a surface of the carbon nanotube film. A distance between adjacent two carbon nanotubes can be larger than a diameter of the carbon nanotubes. The carbon nanotube film can have a free-standing structure. The "free-standing" means that the carbon nanotube film does not have to be formed on a surface of a substrate to be supported by the substrate, but sustain the film-shape by itself due to the great van der Waals attractive force between the adjacent carbon nanotubes in the carbon nanotube film.

Step (a) can include the following steps of: (a1) providing a carbon nanotube array 216; (a2) pulling out a carbon nanotube film from the carbon nanotube array 216 by using a tool (e.g., adhesive tape, pliers, tweezers, or another tool allowing multiple carbon nanotubes to be gripped and pulled simultaneously).

In step (a1), a carbon nanotube array 216 can be a super aligned array formed by the following substeps: (a11) providing a substantially flat and smooth substrate; (a12) forming a catalyst layer on the substrate; (a13) annealing the substrate with the catalyst layer in air at a temperature ranging from about 700° C. to about 900° C. for about 30 to 90 minutes; (a14) heating the substrate with the catalyst layer to a temperature ranging from about 500° C. to about 740° C. in a furnace with a protective gas in the furnace; and (a15) supplying a carbon source gas to the furnace for about 5 to 30 minutes and growing the super-aligned carbon nanotube array 216 on the substrate.

In step (a11), the substrate can be a P-type silicon wafer, an N-type silicon wafer, or a silicon wafer with a film of silicon dioxide thereon. In the present embodiment, a 4-inch P-type silicon wafer is used as the substrate.

In step (a12), the catalyst can be made of iron (Fe), cobalt (Co), nickel (Ni), or any alloy comprising of iron (Fe), cobalt (Co), and nickel (Ni).

In step (a14), the protective gas can be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

The carbon nanotube array 216 can be about 200 micrometers to 400 micrometers in height and include a plurality of carbon nanotubes parallel to each other and approximately perpendicular to the substrate. The carbon nanotubes in the carbon nanotube array 216 can be single-walled carbon nanotubes, double-walled carbon nanotubes, or multi-walled carbon nanotubes. Diameters of the single-walled carbon nanotubes range from about 0.5 nanometers to about 10 nanometers. Diameters of the double-walled carbon nanotubes range from about 1 nanometer to about 50 nanometers. Diameters of the multi-walled carbon nanotubes range from about 1.5 nanometers to about 50 nanometers.

The super-aligned carbon nanotube array 216 formed under the above conditions is essentially free of impurities such as carbonaceous or residual catalyst particles. The carbon nanotubes in the super-aligned carbon nanotube array 216 are closely packed together by van der Waals attractive force.

In step (a2), the carbon nanotube film can be formed by the following substeps: (a21) selecting one or more carbon nanotubes having a predetermined width from the array of carbon nanotubes; and (a22) pulling the carbon nanotubes to form carbon nanotube segments that are joined end to end at an uniform speed to achieve a uniform carbon nanotube film.

In step (a21), the carbon nanotube segments can be selected by using a tool such as an adhesive tape to contact the carbon nanotube array 216. Each carbon nanotube segment includes a plurality of carbon nanotubes parallel to each other.

Figure 4:
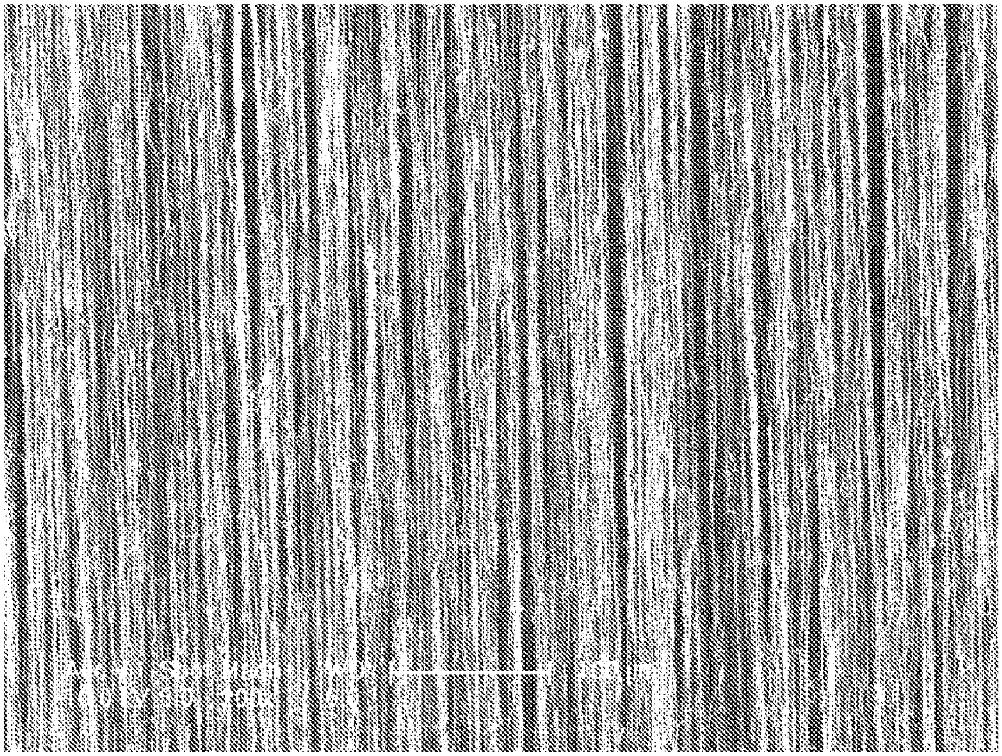
FIG. 4 shows a Scanning Electron Microscope (SEM) image of a carbon nanotube film used in the method for making the individually coated and twisted carbon nanotube wire-like structure.

More specifically, during step (a22), because the initial carbon nanotube segments are drawn out, other carbon nanotube segments are also drawn out end-to-end due to the van der Waals attractive force between ends of adjacent segments. This process of drawing ensures that a continuous, uniform carbon nanotube film having a predetermined width can be formed. Referring to FIG. 4, the carbon nanotube film includes a plurality of carbon nanotubes joined end-to-end. The carbon nanotubes in the carbon nanotube film are all substantially parallel to the pulling/drawing direction of the carbon nanotube film, and the carbon nanotube film produced in such manner can be selectively formed to have a predetermined width. The carbon nanotube film formed by the pulling/drawing method has superior uniformity of thickness and conductivity over a typically disordered carbon nanotube film. Furthermore, the pulling/drawing method is simple, fast, and suitable for industrial applications.

The width of the carbon nanotube film depends on a size of the carbon nanotube array 216. The length of the carbon nanotube film can be arbitrarily set as desire. When the substrate is a 4-inch P-type silicon wafer, as in the present embodiment, the width of the carbon nanotube film ranges from about 0.01 centimeters to about 10 centimeters, the length of the carbon nanotube film can be above 100 meters, and the thickness of the carbon nanotube film ranges from about 0.5 nanometers to about 100 microns. Adjacent two carbon nanotubes joined end to end have an overlap joint, the continuous carbon nanotube film has a high resistance at the overlap joint of adjacent two carbon nanotubes in different segments.

In step (b), the at least one conductive coating can be formed on the carbon nanotube film by a physical vapor deposition (PVD) method such as a vacuum evaporation or a sputtering. In the present embodiment, the at least one conductive coating is formed by a vacuum evaporation method.

The vacuum evaporation method for forming the at least one conductive coating of step (b) can further include the following substeps: (b1) providing a vacuum container 210 including at least one vaporizing source 212; and (b2) heating the at least one vaporizing source 212 to deposit a conductive coating on a surface of the carbon nanotube film.

In step (b1), the vacuum container 210 includes a depositing zone. At least one pair of vaporizing sources 212 includes an upper vaporizing source 212 located on a top surface of the depositing zone, and a lower vaporizing source 212 located on a bottom surface of the depositing zone. The two vaporizing sources 212 are on opposite sides of the vacuum container 210 to coat both sides of each carbon nanotubes. In the current embodiment, each pair of vaporizing sources 212 includes a type of metallic material. The materials in different pairs of vaporizing sources 212 can be arranged in the order of conductive materials orderly formed on the carbon nanotube film. The pairs of vaporizing sources 212 can be arranged along a pulling direction of the carbon nanotube film on the top and bottom surface of the depositing zone. The carbon nanotube film is located in the vacuum container 210 and between the upper vaporizing source 212 and the lower vaporizing source 212. There is a distance between the carbon nanotube film and the vaporizing sources 212. An upper surface of the carbon nanotube film faces the upper vaporizing sources 212. A lower surface of the carbon nanotube film faces the lower vaporizing sources 212. The vacuum container 210 can be evacuated by use of a vacuum pump (not shown).

Figure 5:
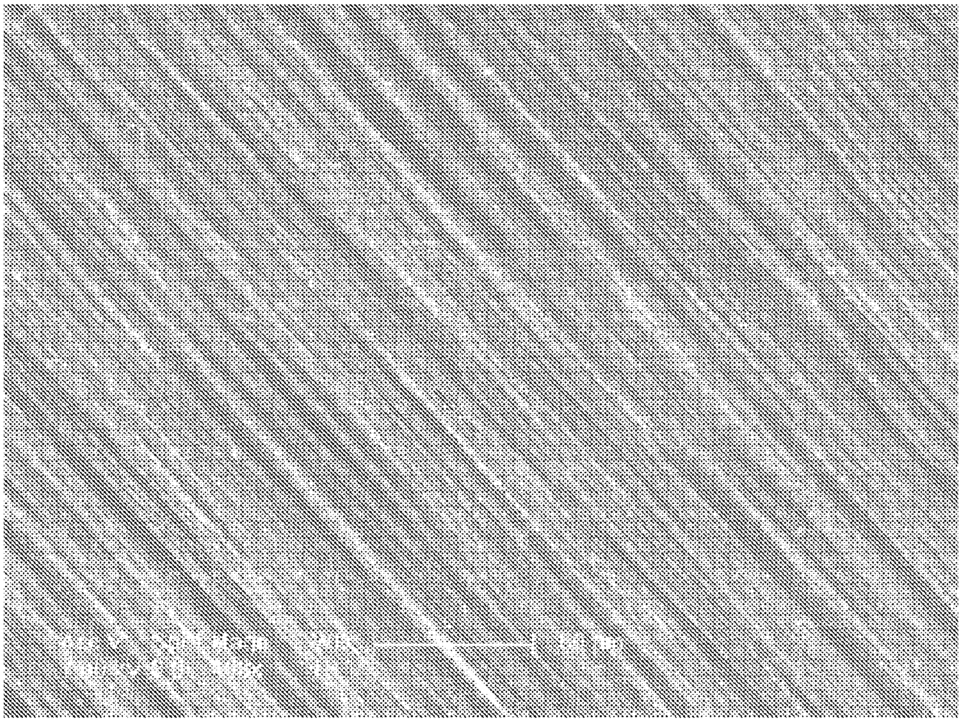
FIG. 5 shows a Scanning Electron Microscope (SEM) image of a carbon nanotube film with at least one conductive coating thereon used in the method for making the individually coated and twisted carbon nanotube wire-like structure.
Figure 6:
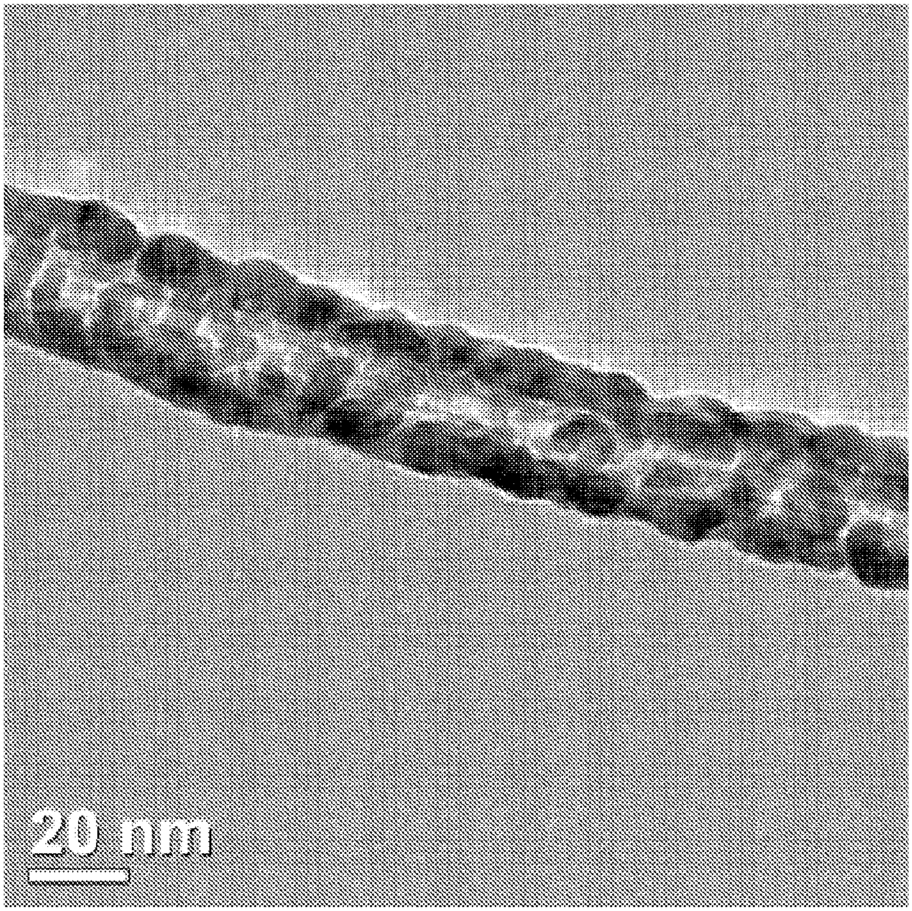
FIG. 6 shows a Transmission Electron Microscope (TEM) image of a carbon nanotube in the carbon nanotube wire-like structure with at least one conductive coating thereon.

In step (b2), the vaporizing source 212 can be heated by a heating device (not shown). The material in the vaporizing source 212 is vaporized or sublimed to form a gas. The gas meets the cold carbon nanotube film and coagulates on the upper surface and the lower surface of the carbon nanotube film. Due to a plurality interspaces existing between the carbon nanotubes in the carbon nanotube film, in addition to the carbon nanotube film being relatively thin, the conductive material can be infiltrated in the interspaces in the carbon nanotube film between the carbon nanotubes. As such, the conductive material can be deposited on the outer surface of most, if not all, of the individual carbon nanotubes. A microstructure of the carbon nanotube film with at least one conductive coating thereon is shown in FIG. 5 and a microstructure of a carbon nanotube therein is shown in FIG. 6.

It is to be understood that a depositing area of each vaporizing source 212 can be adjusted by varying the distance between two adjacent vaporizing sources 212 or the distance between the carbon nanotube film and the vaporizing source 212. Several vaporizing sources 212 can be heated simultaneously, while the carbon nanotube film is pulled through the depositing zone between the vaporizing sources 212 to form a conductive coating.

To increase a density of the gas in the depositing zone, and prevent oxidation of the conductive material, the vacuum degree in the vacuum container 210 is above 1 pascal (Pa). In the present embodiment, the vacuum degree is about $4\times10^{-4}$ Pa.

It is to be understood that the carbon nanotube array 216, such as the one formed in step (a1), can be directly placed in the vacuum container 210. The carbon nanotube film can be pulled in the vacuum container 210 and successively passed by each vaporizing source 212, with each conductive coating continuously depositing thereon. Thus, the pulling step and the depositing step can be processed simultaneously.

In the present embodiment, the method for forming the at least one conductive coating includes the following steps: forming a wetting layer on a surface of the carbon nanotube film; forming a transition layer on the wetting layer; forming a conductive layer on the transition layer; and forming an anti-oxidation layer on the conductive layer. In the above-described method, the steps of forming the wetting layer, the transition layer, and the anti-oxidation layer are optional. Since the carbon nanotubes are coated with at least one conductive coating, overlap joints of adjacent two carbon nanotubes joined end to end have conductive coating thereon, the individually coated nanotube structure with at least one conductive coating has a low resistance at the overlap joint thereof in different segments.

It is to be understood that the method for forming at least one conductive coating on each of the carbon nanotubes in the carbon nanotube structure 214 in step (b) can be a physical method such as vacuum evaporating or sputtering as described above, and can also be a chemical method such as electroplating or electroless plating. In the chemical method, the carbon nanotube structure 214 can be disposed in a chemical solution.

Step (b) further includes forming a strengthening layer outside the at least one conductive coating. More specifically, the carbon nanotube film can be immersed in a container 220 with a liquid polymer. Thus, the entire surface of the carbon nanotubes in the carbon nanotube film can be soaked with the liquid polymer. Then the carbon nanotube film is removed and after concentration (e.g., being cured), a strengthening layer can be formed on the outside of the carbon nanotubes in the carbon nanotube structure 214.

In step (c), the individually coated nanotube structure with at least one conductive coating on each carbon nanotube can be treated with mechanical force (e.g., a conventional spinning process) to acquire an individually coated and twisted carbon nanotube wire-like structure. The carbon nanotube structure is twisted along an aligned direction of carbon nanotubes therein.

In the present embodiment, step (c) can be executed by many methods. One method includes the following steps of: (c1) adhering one end of the carbon nanotube structure to a rotating motor; and twisting the carbon nanotube structure by the rotating motor. Another method includes the following steps of: (c1') supplying a spinning axis; (c2') contacting the spinning axis to one end of the carbon nanotube structure; and (c3') twisting the carbon nanotube structure by the spinning axis.

A plurality of individually coated and twisted carbon nanotube wire-like structures 222 can be stacked or twisted to form one individually coated and twisted carbon nanotube wire-like structure 222 with a larger diameter. A plurality of individually coated and twisted carbon nanotube structures 222 can be arranged parallel to each other and then twisted to form the individually coated and twisted carbon nanotube wire-like structure with the large diameter. Also two or more individually coated and twisted carbon nanotube structures 222 can be stacked and then twisted to form the individually coated and twisted carbon nanotube wire-like structure with the large diameter. In one embodiment, about 500 layers of carbon nanotube films are stacked with each other and twisted to form an individually coated and twisted carbon nanotube wire-like structure 222 whose diameter can reach up to 3 millimeters.

Figure 7:
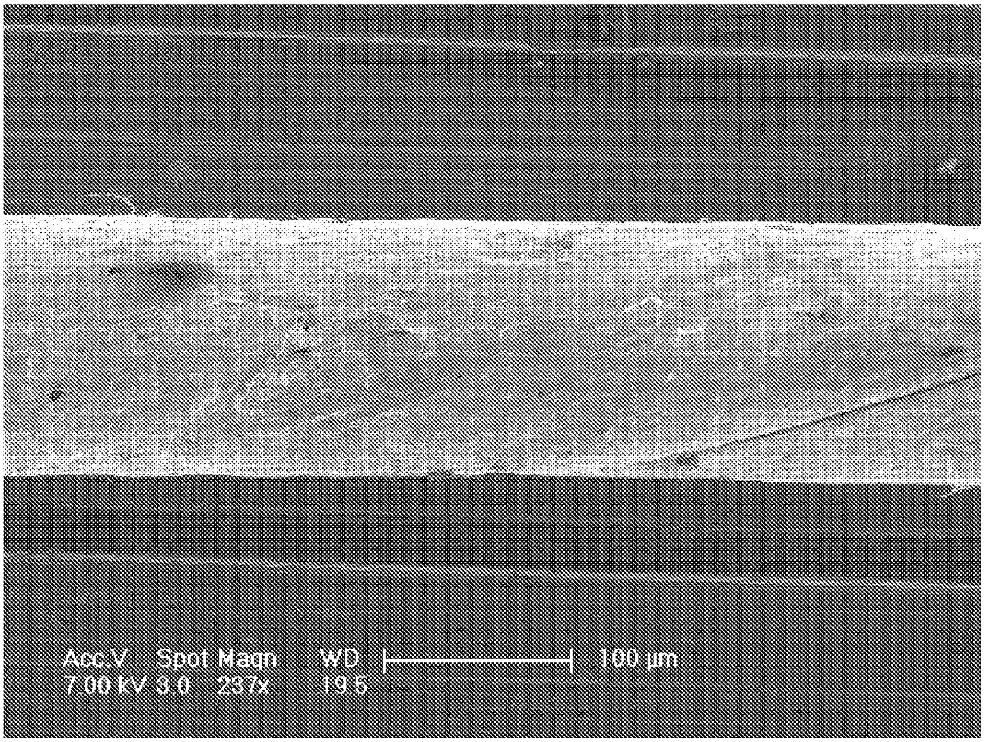
FIG. 7 shows a Scanning Electron Microscope (SEM) image of an individually coated and twisted carbon nanotube wire-like structure.

An SEM image of an individually coated and twisted carbon nanotube wire-like structure 222 can be seen in FIG. 7. The individually coated and twisted carbon nanotube wire-like structure 222 includes a plurality of carbon nanotubes with at least one conductive material on the carbon nanotubes and oriented along an axis of the individually coated and twisted carbon nanotube wire-like structure. The individually coated and twisted carbon nanotube wire-like structure 222 can be further collected by a roller 260 by coiling the individually coated and twisted carbon nanotube wire-like structure 222 onto the roller 260.

Further, the steps of forming the carbon nanotube film, the at least one conductive coating, and the strengthening layer can be processed in a same vacuum container to achieve a continuous production of the individually coated and twisted carbon nanotube wire-like structure 222.

The conductivity of the individually coated and twisted carbon nanotube wire-like structure 222 is better than the conductivity of the carbon nanotube structure 214. The resistivity of the carbon nanotube wire-like structure 222 can be ranged from about $10\times10^{-8}$ Ω·m to about $500\times10^{-8}$ Ω·m. In the present embodiment, the carbon nanotube wire-like structure 222 has a diameter of about 120 microns, and a resistivity of about $360\times10^{-8}$ Ω·m. The resistivity of the carbon nanotube structure 214 without conductive coating is about $1\times10^{-5}$ Ω·m~$2\times10^{-5}$ Ω·m.

The individually coated and twisted carbon nanotube wire-like structure provided in the present embodiment has at least the following superior properties. Firstly, the individually coated and twisted carbon nanotube wire-like structure includes a plurality of oriented carbon nanotubes joined end-to-end by van der Waals attractive force. Thus, the individually coated and twisted carbon nanotube wire-like structure has high strength and toughness. Secondly, the outer surface of each carbon nanotube is covered by at least one conductive coating. Thus, the individually coated and twisted carbon nanotube wire-like structure has high conductivity. Thirdly, the method for forming the individually coated and twisted carbon nanotube wire-like structure is simple and relatively inexpensive. Additionally, the individually coated and twisted carbon nanotube wire-like structure can be formed continuously and, thus, a mass production of the individually coated and twisted carbon nanotube wire-like structure can be achieved. Fourthly, since the carbon nanotubes have a small diameter, the individually coated and twisted carbon nanotube wire-like structure includes a plurality of carbon nanotubes and at least one conductive coating thereon, thus the individually coated and twisted carbon nanotube wire-like structure has a smaller width than a metal wire formed by a conventional wire-drawing method and can be used in ultra-fine cables. Finally, since the carbon nanotubes are hollow, and a thickness of the at least one layer of the conductive material is just several nanometers, thus a skin effect would not occur in the individually coated and twisted carbon nanotube wire-like structure, and signals will not decay in the process of transmission.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that the above description and the claims drawn to a method may include some indication in reference to certain steps. However, the indication used is only to be viewed for identification purposes and not as a suggestion as to an order for the steps.

What is claimed is:

1. A method for making an individually coated and twisted carbon nanotube wire structure, the method comprising the steps of:

(a) providing a carbon nanotube structure having a plurality of carbon nanotubes;

(b) forming at least one conductive coating on the plurality of carbon nanotubes in the carbon nanotube structure, and forming a strengthening layer surrounding the at least one conductive coating by immersing the carbon nanotube structure with the at least one conductive coating applied to the plurality of carbon nanotubes in a liquid polymer, such that the entire surface of the carbon nanotubes in the carbon nanotube structure are soaked with the liquid polymer, removing the carbon nanotube structure, and curing the liquid polymer; and (c) twisting the carbon nanotube structure coated with the at least one conductive coating.

2. The method as claimed in claim 1, wherein in step (a), the plurality of carbon nanotubes is substantially parallel to a surface of the carbon nanotube structure.

3. The method as claimed in claim 1, wherein the carbon nanotube structure is a carbon nanotube film.

4. The method as claimed in claim 3, wherein the carbon nanotube film comprises a plurality of carbon nanotubes, and the plurality of carbon nanotubes therein is aligned along a same direction.

5. The method as claimed in claim 3, wherein the carbon nanotube film comprises a plurality of successively oriented carbon nanotube segments joined end-to-end by van der Waals attractive force therebetween, each carbon nanotube segment comprises a plurality of the carbon nanotubes parallel to each other, and combined by van der Waals attractive force therebetween.

6. The method as claimed in claim 1, wherein in step (b), the at least one conductive coating is formed on each of the plurality of carbon nanotubes in the carbon nanotube structure by means of physical vapor deposition.

7. The method as claimed in claim 6, wherein the conductive coating is formed by means of vacuum evaporation or sputtering.

8. The method as claimed in claim 7, wherein step (b) is executed by the following steps of:

(b1) providing a vacuum container including at least one conductive material vaporizing source; and (b2) heating the at least one conductive material vaporizing source to deposit a conductive coating on the plurality of carbon nanotubes in the carbon nanotube structure.

9. The method as claimed in claim 8, wherein in step (b2), the conductive coating is formed on an outer surface of each of the plurality of carbon nanotubes in the carbon nanotube structure.

10. The method as claimed in claim 9, wherein a material of the conductive layer comprises of a material selected from the group consisting of gold, silver, copper and any alloy thereof.

11. The method as claimed in claim 9, wherein a thickness of the conductive layer ranges from about 1 nanometer to 20 nanometers.

12. The method as claimed in claim 9, wherein step (b) further comprises forming a wetting layer on the plurality of carbon nanotubes in the carbon nanotube structure, and forming a transition layer on the wetting layer before the conductive layer.

13. The method as claimed in claim 9, wherein in step (b), an anti-oxidation layer is formed on the conductive layer.

14. The method as claimed in claim 1, wherein in step (c), the carbon nanotube structure is treated with a mechanical force.

15. The method as claimed in claim 14, wherein step (c) comprises the following steps of:

(c1) adhering one end of the carbon nanotube structure coated with the at least one conductive coating to a rotating motor; and (c2) twisting the carbon nanotube structure coated with the at least one conductive coating with the rotating motor.

16. The method as claimed in claim 14, wherein step (c) comprises the following steps of:

(c1') supplying a spinning axis;

(c2') contacting the spinning axis to one end of the carbon nanotube structure coated with the at least one conductive coating; and (c3') twisting the carbon nanotube structure coated with the at least one conductive coating by the spinning axis.

17. A method for making an individually coated and twisted carbon nanotube wire structure, the method comprising the steps of:

(a) providing a carbon nanotube structure having a plurality of carbon nanotubes aligned along a same direction and joined end to end by van der Waals attractive force therebetween to form a free-standing structure;

(b) forming at least one conductive coating on the plurality of carbon nanotubes in the carbon nanotube structure, wherein each of the plurality of carbon nanotubes is covered by the at least one conductive coating on an outer surface thereof; and (c) twisting the carbon nanotube structure coated with the at least one conductive coating.

18. The method as claimed in claim 17, wherein step (b) further comprises forming a strengthening layer surrounding the at least one conductive coating.

19. The method as claimed in claim 18, wherein the strengthening layer is formed by immersing the carbon nanotube structure with the at least one conductive coating applied to the plurality of carbon nanotubes in a liquid polymer, such that the entire surface of the carbon nanotubes in the carbon nanotube structure are soaked with the liquid polymer, removing the carbon nanotube structure, and curing the liquid polymer.

* * * * *